United States Patent
Pino et al.

(10) Patent No.: US 7,353,473 B2
(45) Date of Patent: Apr. 1, 2008

(54) MODELING SMALL MOSFETS USING ENSEMBLE DEVICES

(75) Inventors: Robinson E. Pino, Milton, VT (US); Henry W. Trombley, Starksboro, VT (US); Josef S. Watts, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 11/381,613

(22) Filed: May 4, 2006

(65) Prior Publication Data

US 2007/0261011 A1 Nov. 8, 2007

(51) Int. Cl.
*G06F 17/50* (2006.01)
*G06F 17/10* (2006.01)

(52) U.S. Cl. ................ 716/4; 703/2; 703/14
(58) Field of Classification Search .......... 716/4; 703/2, 14
See application file for complete search history.

(56) References Cited

U.S. PATENT DOCUMENTS

| | | | | |
|---|---|---|---|---|
| 3,683,417 A | * | 8/1972 | Gummel | 716/1 |
| 5,687,355 A | * | 11/1997 | Joardar et al. | 716/20 |
| 6,438,733 B1 | * | 8/2002 | Clement | 716/4 |
| 6,480,986 B1 | * | 11/2002 | Richer | 716/4 |
| 6,725,185 B2 | * | 4/2004 | Clement | 703/14 |
| 6,920,417 B2 | * | 7/2005 | Lescot et al. | 703/13 |
| 7,162,402 B2 | * | 1/2007 | Daems et al. | 703/13 |

* cited by examiner

*Primary Examiner*—Phallaka Kik
(74) *Attorney, Agent, or Firm*—W. Riyon Harding

(57) ABSTRACT

A method of modeling statistical variation of field effect transistors having fingers physically measures characteristics of existing transistors and extracts a scaled simulation based on the characteristics of the existing transistors using a first model. The method creates synthetic single finger data using the scaled simulation. The method physically measures characteristics of existing pairs of matched transistors and extracts random dopant fluctuations from the characteristics of the existing pairs of matched transistors using a second model that is different than the first model. The method extracts a single finger from the synthetic single finger data and the random dopant fluctuations using the first model. The method can also create an ensemble model by determining the skew between a typical single device model and a typical ensemble model. The method adjusts parameters of the first model to cause the single finger to match targets for the single finger. Also, the method produces the centered scalable single finger model (model C) after the adjustments are complete.

4 Claims, 1 Drawing Sheet

MODELING SMALL MOSFETS USING ENSEMBLE DEVICES

BACKGROUND AND SUMMARY

The embodiments of the invention generally relate to a circuit simulation that creates synthetic single finger data using a scaled simulation and extracts a single finger model from the synthetic single finger data and a random dopant fluctuation (RDF) model.

When characterizing small area field effect transistors FETs for modeling, it is common practice to measure an ensemble of many devices in parallel and then use the average current as the typical behavior of a single small device. [1] This reduces the sampling error caused by random dopant fluctuation and line edge roughness. However, using this average current introduces a distortion of the drain current versus gate voltage characteristics. Specifically in the subthreshold and low overdrive regions the average current in the ensemble is higher than the typical current, but in the high overdrive region the average current equals the typical current. This application presents a compact modeling method for accurate extraction of typical behavior from ensemble measurements and reproducing either single finger or ensemble currents for circuit simulation.

Consider a small FET composed of two fingers. In the absence of manufacturing variations each finger has the same current voltage (IV) characteristics and the current of the two fingers in parallel is twice the current of one finger. In practice small FET fingers display variation in threshold voltage due to random dopant fluctuations (RDF).[2] Suppose the threshold voltage of one finger in our hypothetical FET is 30 millivolts higher than typical and that of the other finger is 30 millivolts lower. On average the fingers have the typical Vt and so in some sense this is a typical FET subject to RDF. One finger will have more current than typical and the other less. Well above threshold, the differences in current from typical will be roughly proportional to the differences of threshold voltage Vt from typical because the current is roughly linear with gate voltage. In this example, the total current will be approximately twice the typical value for one finger. On the other hand, below threshold, the current is exponentially related to the threshold voltage and the two fingers will not have equal and opposite current deltas. If one finger has twice the typical current and the other will have roughly half the typical current. The total current will be 2.5 times the typical for one finger, not two times as we might expect from a typical device.

If the Vt of the total device is measured by the single point method a lower Vt than the average of the individual finger Vt's will be found. This effect has been observed when trying to estimate the quiescent current for CMOS SRAMs [3] and logic chips [4,5]. These researchers have noted that the distribution of off currents is lognormal because of the logarithmic relationship between off current and both threshold voltage and FET gate length.

This effect must be considered when extracting a compact model from measurements of multiple devices in parallel. If the model is adjusted to match line targets it is important to understand the structures used to establish and monitor the line targets. Ensemble devices will produce higher off current targets and lower Vt targets than single finger devices for the same manufacturing process. Finally since circuit designers use small FETs both in parallel arrangements and as single FETs, the compact model needs to be able to model both cases correctly.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
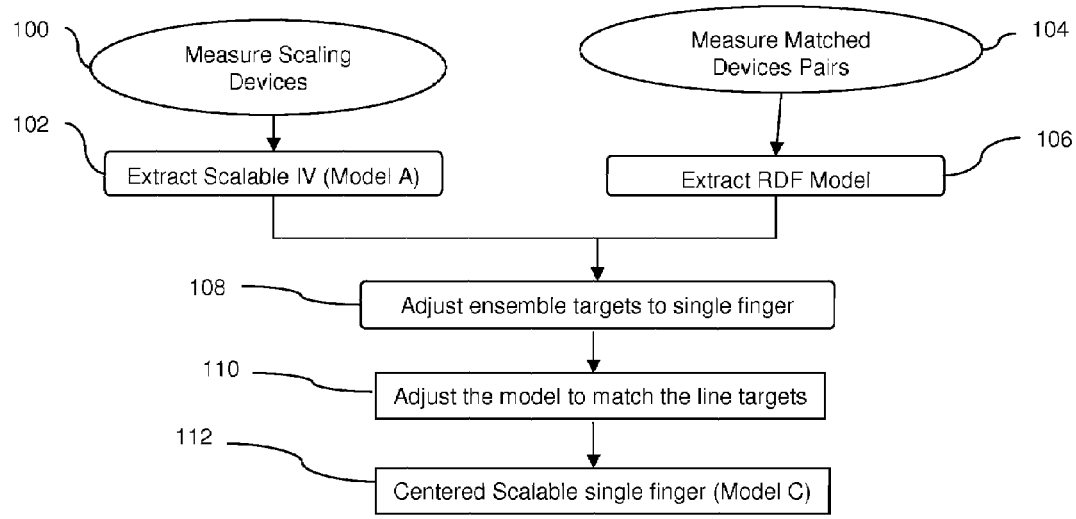
FIG. 1 is a flow diagram illustrating a method of an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The statistical distortion of the measured IV characteristics of ensembles of devices needs to be accounted for in model extraction and circuit simulation. FIG. 1 illustrates a method of adjusting a model to match targets where the targets are derived from measurement of ensemble device and the model represents single finger devices. More specifically, in item 100, the method physically measures characteristics of existing transistors and in item 102, the method extracts a scaled simulation based on the characteristics of the existing transistors using a first model. Then, in item 104, the method physically measures characteristics of existing pairs of matched transistors and, in item 106, extracts random dopant fluctuations from the characteristics of the existing pairs of matched transistors using a second model that is different than the first model. Next, in item 108, the method adjusts the ensemble derived targets to single finger targets, then in item 110 adjusts the parameters of the first model to cause the single finger model to match targets for the single finger. Also, in item 112, the method produces the centered scalable single finger model (model C) after the adjustments in item 108 are complete.

Targets specified as currents are adjusted using the same equations as used to adjust the ensemble data to single finger data. Targets expressed as threshold voltages are adjusted using: $\Delta Vt = s\sigma_{Vt}^2/2V_\theta$ where $\Delta Vt$ is the threshold voltage shift, $$s = 1 - \left(\frac{2}{n} - \frac{1}{n^2}\right),$$

$\sigma_{Vt}^2$ is the variance of the threshold voltage calculated by the RTP model, and $V_\theta$ is nkt, the ideality times the thermal voltage.

Figure 2:
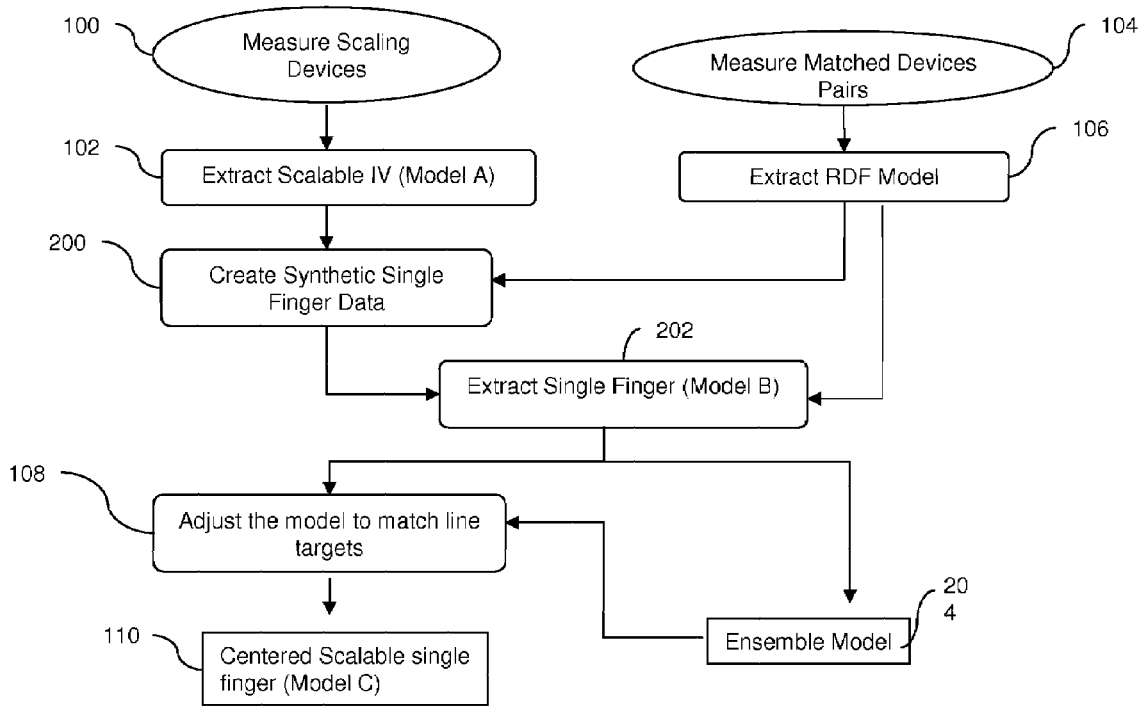
FIG. 2 is a flow diagram illustrating a method of an embodiment of the invention.

The method shown in FIG. 2 does not require any new measurements when compared to the process shown in FIG. 1, however, it does require new extraction steps and extra time independent calculations during circuit simulation. DC measurements of geometric scaling FETs, including ensembles of small area FETs, and model extraction are done as usual, as is measurement of match FET pairs and extraction of a random dopant fluctuation (RDF) model.

More specifically, FIG. 2, shows a method of modeling statistical variation of field effect transistors having fingers. Again, in item 100, the method physically measures characteristics of existing transistors and in item 102, the method extracts a scaled simulation based on the characteristics of the existing transistors using a first model. However, in item 200, the method shown in FIG. 2 creates synthetic single finger data using the scaled simulation and applying the following expression:

$$I_1 = xI_e$$

where:

$$x = \frac{48}{48 + 24\beta\sigma_{Vt}^2 + 6\beta^2\sigma_{Vt}^4 + \beta^3\sigma_{Vt}^6};$$

$$\beta = \frac{\frac{d^2 I}{dV_t^2}}{I}$$

and where $d^n$ represents a derivative level, $I_1$ represents single finger current, $I_e$ represents ensemble current, and $V_t$ represents threshold voltage, as explained in greater detail below.

As shown above, in item 104, the method physically measures characteristics of existing pairs of matched transistors and, in item 106, extracting random dopant fluctuations from the characteristics of the existing pairs of matched transistors using a second model that is different than the first model. However, in item 202, the method shown in FIG. 2 adjusts the first model using the synthetic single finger data and the random dopant fluctuations, producing the single finger model. Then, in item 204, the method creates an ensemble model by applying the following expression:

$$s = 1 - \left(\frac{2}{n} - \frac{1}{n^2}\right),$$

where s comprises the skew between a typical single device model and a typical ensemble model, and n comprises the number of devices in the ensemble, as discussed in greater detail below.

In item 110, the method adjusts parameters of the first model to cause the single finger to match targets for the single finger. Also, in item 112, the method produces the centered scalable single finger model (model C) after the adjustments are complete.

The extracted model (model A) in item 102 which represents the measured ensemble devices is used to create the synthetic dataset in item 200. This data is adjusted to estimate single device typical data using the RDF model and the procedure shown below.

In item 202, the DC model is fit to the single device data by adjusting a few parameters, as discussed below, creating model B. The parameter differences between models A and B are used to create the ensemble model in item 204. When the model is run, the ensemble model examines the instance parameters and adjusts the model card parameters for the actual number of parallel fingers or devices. In item 110, Model B is adjusted to match line targets, using the ensemble model to account for the actual number of fingers in the FETs used for line monitoring. The resulting model (model C) in item 112 represents single finger FETs but in combination with the ensemble model can simulate FETs with any number of fingers.

Measurement of an ensemble device is equivalent to estimating the mean current at each applied voltage of a finite sample of single fingers. If we assume the fingers are identical except for threshold voltage and that the threshold voltages are independent and normally distributed, we can recover the current of a typical single finger in item 200. A typical finger is one with the typical or average Vt. The same procedure applies to both measured and simulated data. We begin by expressing the current of any finger as a function of $(V_g - V_t + \Delta_i)$ and expanding in a Taylor series. ($\Delta_i$ the difference between the Vt of this finger and the mean Vt and we note that the derivative with respect to $\Delta_i$ is the same as with respect to $V_g$).

$$I_i = I(V_g - V_t + \Delta_i) \quad (1)$$

$$I_i = I_0 + \frac{dI}{dV_g}\Delta_i + \frac{1}{2}\frac{d^2 I}{dV_g^2}\Delta_i^2 + \ldots$$

To calculate the total current of an ensemble, we sum over all fingers and use the properties of the normal distribution to evaluate the sum over powers of $\Delta$.

$$I_e = \frac{1}{n}\sum_i I_i = I_0 + \frac{dI}{dV_g}\frac{1}{n}\sum_i \Delta_i + \frac{1}{2}\frac{d^2 I}{dV_g^2}\frac{1}{n}\sum_i \Delta_i^2 + \ldots \quad (2)$$

$$I_e = \sum_i I_i = I_0 + 0 + \frac{1}{2}\frac{d^2 I}{dV_g^2}\sigma_{Vt}^2 + \ldots$$

In this expression $\sigma_{Vt}^2$ is the variance of threshold voltage between identical FETs close to one another, exactly what is typically measured for RDF modeling. $I_e$ is the current we have measured; in order to solve for the typical single finger current in item 202 we must make one more assumption. We assume that the ratio of single finger and ensemble currents and the ratios of their derivatives of any order are equal to a single number we call x. In the subthreshold region where this effect is most important, the current is approximately exponential in $V_g$ and this is a good assumption. Above threshold the difference in currents is small, making the value of the ratios of currents and derivatives all close to one. With this assumption we can rewrite (2) and solve for x. We have shown only the first two terms of the expansion for clarity but we find in practice that terms up through the sixth power may be needed. We show them in the final result only.

$$I_e = xI_e + 0 + x\frac{1}{2}\frac{d^2 I_e}{dV_t^2}\sigma_{Vt}^2 + \ldots$$

solving for x:

$$x = \frac{48}{48 + 24\beta\sigma_{Vt}^2 + 6\beta^2\sigma_{Vt}^4 + \beta^3\sigma_{Vt}^6}$$

Where the invention uses the properties of the exponential function to estimate the fourth and sixth derivatives as:

$$\frac{d^4 I}{dV_t^4} = \beta\frac{d^2 I}{dV_t^2};\ \frac{d^6 I}{dV_t^6} = \beta^2\frac{d^2 I}{dV_t^2}\text{ where }\beta = \frac{\frac{d^2 I}{dV_t^2}}{I}$$

and where $d^n$ represents a derivative level, I represents current, and $V_t$ represents threshold voltage. This is used to create the synthetic single finger data in item 200 and extract a single finger in item 202. Above threshold the higher order terms are small so using the above formulas does not introduce significant error.

To invoke a device model that is dependent on the number of parallel ensemble devices requires that we create a parameterized model that we can skew in a continuous mode from the typical single device model to the typical ensemble model with infinite devices in parallel in item 204. We create this model by first extracting the model parameters for the large ensemble of devices in item 106. We then use this model as a starting point to fit the single typical device data set we calculated in item 200. For practical reasons, in item 204 we want to skew as few model parameters as possible. We have chosen three parameters that have strong influence on the model behavior in the subthreshold region.

To skew between the typical single device model and the typical ensemble model, we use an empirically expression:

$$s = 1 - \left(\frac{2}{n} - \frac{1}{n^2}\right) \quad (3)$$

where, n the number of devices in the ensemble (this is shown in item 204). Model parameters are now modified on an instance basis using only a few parameters, where $Px_e$ is the model parameter extracted using the ensemble data set and adjusted for n→∞ and $Px_1$ is the model parameter extracted using the synthetic single device data set.

$$Px_n = Px_1 + s(Px_e - Px_1)$$

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

REFERENCES

[1] H. Lee, et al, IEEE ED Letters, Vol. 23, No. 5, May 2002
[2] J. T. Watt and J. D. Plummer, IEEE Trans. on ED, Vol. 35, No. 12
[3] T. B. Hook, et al, IEEE Trans. on ED, Vol. 49, No. 8, Aug. 2002
[4] R. Rao, et al, IEEE Trans. on VLSI, Vol. 12, No. 2, Feb. 2004
[5] I. A. Ferzli and F. N. Najam, IEEE Trans. on CAD of IC, V25, I1, January 2006

What is claimed is:

1. A method of modeling statistical variation of field effect transistors having fingers comprising:
    physically measuring characteristics of existing transistors;
    extracting a scaled simulation based on said characteristics of said existing transistors using a first model;
    physically measuring characteristics of existing pairs of matched transistors;
    extracting random dopant fluctuations from said characteristics of said existing pairs of matched transistors using a second model;
    creating synthetic single finger data using said scaled simulation and said dopant fluctuation and applying the following expressions:

$$I_1 = sxI_e,$$

$$x = \frac{48}{48 + 24\beta\sigma_{Vt}^2 + 6\beta^2\sigma_{Vt}^4 + \beta^3\sigma_{Vt}^6},$$

$$\frac{d^4 I}{dV_t^4} = \beta\frac{d^2 I}{dV_t^2};\ \frac{d^6 I}{dV_t^6} = \beta^2\frac{d^2 I}{dV_t^2}\text{ where }\beta = \frac{\frac{d^2 I}{dV_t^2}}{I}$$

and where $d^n$ represents a derivative n level, I represents current, $I_1$ represents single finger current, $I_e$ represents ensemble current, $V_t$ represents threshold voltage, and $\sigma_{vt}^n$ represents variance of threshold voltage in which n is an integer;
    extracting a single finger model from said synthetic single finger data and said random dopant fluctuations using said first model;
    creating an ensemble model by applying the following expression:

$$s = 1 - \left(\frac{2}{n} - \frac{1}{n^2}\right),$$

where s comprises a skew between a typical single device model and a typical ensemble model, and n comprises a number of devices in the ensemble; and adjusting parameters of said first model to cause said single finger model to match targets for said single finger model.

2. The method according to claim 1, wherein all said fingers are identical except for threshold voltage values.

3. The method according to claim 1, wherein said first model is different than said second model.

4. A method of creating an accurate model of single finger transistors for ensemble data comprising:

physically measuring characteristics of existing pairs of matched transistors;

extracting a random dopant fluctuation (RDF) model from said characteristics of said existing pairs of matched transistors;

physically measuring characteristics of existing transistors;

extracting a scaled model based on said characteristics of said existing transistors;

applying statistical calculations to ensemble derived targets using a variance of the RDF model to derive single finger targets;

adjusting the scaled model to match a single finger characteristics, wherein the statistical calculation are done using:

$$I_1 = sxI_e$$

$$x = \frac{48}{48 + 24\beta\sigma_{V_t}^2 + 6\beta^2\sigma_{V_t}^4 + \beta^3\sigma_{V_t}^6}$$

for adjusting currents and $\Delta Vt = s\sigma_{Vt}^2/2V_{74}$, $$s = 1 - \left(\frac{2}{n} - \frac{1}{n^2}\right),$$

where $\Delta Vt$ is a threshold voltage shift, in which n is a number of devices in the ensembled derived targets where $$\beta = \frac{\frac{d^2I}{dV_t^2}}{I},$$

where $d^n$ represents a derivative n level, I represents current, $I_1$ represents single finger current, $I_e$ represents ensemble current, and $\sigma_{vt}^n$ represents variance of threshold voltage in which n is an integer.

* * * * *